(12) United States Patent
Lau et al.

(10) Patent No.: US 10,229,630 B2
(45) Date of Patent: Mar. 12, 2019

(54) PASSIVE-MATRIX LIGHT-EMITTING DIODES ON SILICON MICRO-DISPLAY

(71) Applicant: The Hong Kong University of Science and Technology, Kowloon (HK)

(72) Inventors: Kei May Lau, Kowloon (HK); Zhaojun Liu, New Territories (HK); Wing Cheung Chong, New Territories (HK); Wai Keung Cho, Kowloon (HK); Chu Hong Wang, Kowloon (HK)

(73) Assignee: THE HONG KONG UNIVERSITY OF SCIENCE AND TECHNOLOGY, Kowloon (HK)

( * ) Notice: Subject to any disclaimer, the term of this patent is extended or adjusted under 35 U.S.C. 154(b) by 70 days.

(21) Appl. No.: 14/710,843

(22) Filed: May 13, 2015

(65) Prior Publication Data
US 2015/0332635 A1    Nov. 19, 2015

Related U.S. Application Data

(60) Provisional application No. 61/996,667, filed on May 14, 2014.

(51) Int. Cl.
*G09G 3/32* (2016.01)
*G09G 3/34* (2006.01)
(Continued)

(52) U.S. Cl.
CPC .............. *G09G 3/32* (2013.01); *G09G 3/3216* (2013.01); *G09G 3/3266* (2013.01);
(Continued)

(58) Field of Classification Search
None
See application file for complete search history.

(56) References Cited

U.S. PATENT DOCUMENTS

| | | | |
|---|---|---|---|
| 4,039,890 A | | 8/1977 | Bailey et al. |
| 5,060,027 A | * | 10/1991 | Hart ...................... H01L 27/156 257/779 |

(Continued)

FOREIGN PATENT DOCUMENTS

| | | |
|---|---|---|
| CN | 103426379 A | 12/2013 |
| CN | 203433750 | 2/2014 |

(Continued)

OTHER PUBLICATIONS

Cheng-Wei Sun, et al. "71-1: Development of Micro—Pixellated GaN LED Array Micro—Display System." SID Symposium Digest of Technical Papers. vol. 42. No. 1. Blackwell Publishing Ltd, 2011.

(Continued)

*Primary Examiner* — David D Davis
(74) *Attorney, Agent, or Firm* — Amin, Turocy & Watson, LLP

(57) ABSTRACT

A passive-matrix light-emitting diodes on silicon (LEDoS) micro-display is presented herein. The LEDoS micro-display comprises a passive-matrix micro-light-emitting diode (LED) array comprising passive-matrix micro-light-emitting diodes (LEDs), and a display driver configured to apply column signals to columns of LED pixels of the passive-matrix micro-LED array and scan signals to rows of the LED pixels, wherein the passive-matrix micro-LED array is flip-chip bonded to the display driver based on solder bumps located at peripheral areas of the passive-matrix micro-LED array.

21 Claims, 14 Drawing Sheets

(51) Int. Cl.
*H01L 25/16* (2006.01)
*H01L 33/00* (2010.01)
*H01L 33/24* (2010.01)
*G09G 3/3216* (2016.01)
*G09G 3/3266* (2016.01)
*H01L 27/15* (2006.01)

(52) U.S. Cl.
CPC ........... *G09G 3/3413* (2013.01); *H01L 25/16* (2013.01); *H01L 25/167* (2013.01); *H01L 33/007* (2013.01); *H01L 33/0095* (2013.01); *H01L 33/24* (2013.01); *G09G 2300/0452* (2013.01); *G09G 2300/06* (2013.01); *G09G 2330/028* (2013.01); *H01L 27/156* (2013.01); *H01L 2924/0002* (2013.01); *H01L 2933/0016* (2013.01)

(56) References Cited

U.S. PATENT DOCUMENTS

| | | | | |
|---|---|---|---|---|
| 5,827,753 A * | 10/1998 | Huang | ............... | H01L 27/156 438/169 |
| 5,929,474 A * | 7/1999 | Huang | ............... | H01L 27/3248 257/114 |
| 7,598,149 B2 | 10/2009 | Dawson et al. | | |
| 2004/0095300 A1 * | 5/2004 | So | ............... | G09G 3/3216 345/82 |
| 2004/0233125 A1 * | 11/2004 | Tanghe | ............... | G06F 3/1446 345/1.3 |
| 2004/0233148 A1 * | 11/2004 | Tanghe | ............... | G09G 3/3216 345/83 |
| 2005/0007321 A1 * | 1/2005 | Schuler | ............... | G09G 3/3216 345/82 |
| 2005/0017922 A1 * | 1/2005 | Devos | ............... | G09G 3/3216 345/6 |
| 2005/0030267 A1 * | 2/2005 | Tanghe | ............... | G09G 3/3216 345/82 |
| 2005/0140610 A1 * | 6/2005 | Smith | ............... | G09G 3/3216 345/77 |
| 2005/0219163 A1 * | 10/2005 | Smith | ............... | G09G 3/3216 345/76 |
| 2006/0001613 A1 * | 1/2006 | Routley | ............... | G09G 3/3216 345/76 |
| 2006/0050032 A1 * | 3/2006 | Gunner | ............... | G09G 3/2077 345/82 |
| 2007/0046603 A1 * | 3/2007 | Smith | ............... | G09G 3/3216 345/90 |
| 2007/0046611 A1 * | 3/2007 | Routley | ............... | G09G 3/3216 345/98 |
| 2007/0069992 A1 * | 3/2007 | Smith | ............... | G09G 3/2014 345/76 |
| 2007/0085779 A1 * | 4/2007 | Smith | ............... | G09G 3/3216 345/76 |
| 2008/0186258 A1 * | 8/2008 | Ishimoto | ............... | G09G 3/3216 345/76 |
| 2008/0291122 A1 * | 11/2008 | Smith | ............... | G06F 17/16 345/55 |
| 2008/0303756 A1 * | 12/2008 | Smith | ............... | G09G 3/2011 345/77 |
| 2011/0309378 A1 * | 12/2011 | Lau | ............... | H01L 27/156 257/88 |
| 2013/0021309 A1 * | 1/2013 | Kothari | ............... | G09G 3/3466 345/211 |
| 2013/0126890 A1 * | 5/2013 | Bedell | ............... | H01L 27/156 257/76 |
| 2014/0299837 A1 | 10/2014 | Bibl et al. | | |
| 2016/0323968 A1 * | 11/2016 | Yue | ............... | H01L 25/167 |

FOREIGN PATENT DOCUMENTS

| | | |
|---|---|---|
| JP | 2006190851 | 7/2006 |
| TW | 201349556 | 12/2013 |

OTHER PUBLICATIONS

C. W. Jeon, et al. "Fabrication of matrix-addressable InGaN-based microdisplays of high array density." Photonics Technology Letters, IEEE 15.11 (2003): 1516-1518.

Jacob Day, et al. "III-Nitride full-scale high-resolution microdisplays." Applied Physics Letters 99.3 (2011): 031116.

J. Day, et al. "Full-scale self-emissive blue and green microdisplays based on GaN micro-LED arrays." Proc. SPIE 8268, Quantum Sensing and Nanophotonic Devices IX, 82681X (Jan. 20, 2012).

Z. Gong, et al. "Efficient flip-chip InGaN micro-pixellated light-emitting diode arrays: promising candidates for micro-displays and colour conversion." Journal of Physics D: Applied Physics 41.9 (2008): 094002.

* cited by examiner

PASSIVE-MATRIX LIGHT-EMITTING DIODES ON SILICON MICRO-DISPLAY

PRIORITY CLAIM

This application claims priority to U.S. Provisional Patent Application No. 61/996,667, filed on May 14, 2014, entitled "LIGHT EMITTING DIODE MICRO-DISPLAY ON APPLICATION SPECIFIC INTEGRATED CIRCUITS", the entirety of which is incorporated by reference herein.

TECHNICAL FIELD

The subject disclosure generally relates to a passive-matrix light-emitting diodes on silicon (LEDoS) micro-display.

BACKGROUND

Passive/active-matrix addressing schemes have been utilized to control pixels of display devices. A passive-matrix based display uses a grid of conductive metal to activate pixels of a display. On the other hand, an active-matrix display uses a matrix of capacitors and transistors to activate pixels of a display, in which each capacitor corresponding to a pixel can hold, store, etc. charge for one screen refresh cycle of the display.

Active-matrix displays have been a mainstream product in the large size and high resolution display market. Although attempts have been made to form an active-matrix display by combining micro-light-emitting diodes with a complementary metal-oxide-semiconductor (CMOS) integrated circuit (IC) chip using flip-chip bonding, such conventional display technologies have had some drawbacks with respect to incurring thermal mismatch between the micro-light-emitting diodes (micro-LEDs) and silicon materials, and inconsistency in bonding of fine pitch solder bumps, leaving much room for improvement.

BRIEF DESCRIPTION OF THE DRAWINGS

Non-limiting embodiments of the subject disclosure are described with reference to the following figures, wherein like reference numerals refer to like parts throughout the various views unless otherwise specified.

DETAILED DESCRIPTION

Figure 1:
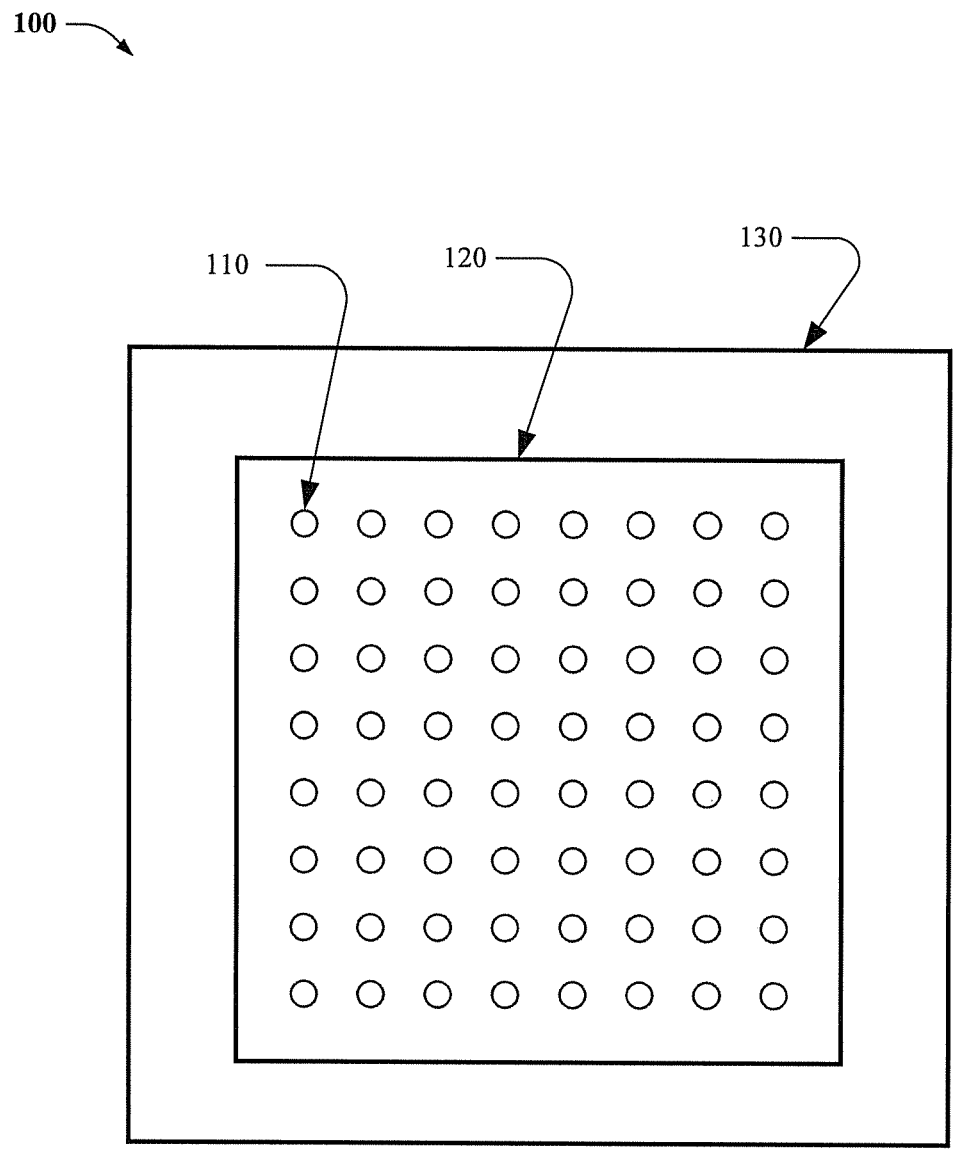
FIG. 1 illustrates a block diagram of a top view of an LEDoS micro-display, in accordance with various embodiments.

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

As mentioned, conventional display technologies have had some drawbacks with respect to integrating micro-LEDs with an IC in an effective manner. Various embodiments disclosed herein can improve display performance and manufacturing yields by providing a passive-matrix LEDoS micro-display comprising a micro-LED array that has been flip-chip bonded onto an ASIC display driver.

For example, a display, e.g., LEDoS micro-display, can comprise a passive-matrix micro-LED array comprising passive-matrix addressable micro-LED pixels. Further, the LEDoS micro-display can comprise a display driver, e.g., application specific integrated circuit (ASIC), programmable logic device (PLD), field programmable device (FPGA), etc. configured to apply column signals to columns of LED pixels of the passive-matrix micro-LED array and scan signals to rows of the LED pixels. Furthermore, the passive-matrix micro-LED array is flip-chip bonded to the display driver based on solder bumps located at peripheral areas of the passive-matrix micro-LED array.

In one embodiment, a first number, amount, etc. of the solder bumps, e.g., 448, is less than a second number, amount, etc. of the LED pixels, e.g., 256×193. In another embodiment, the solder bumps comprise indium bumps.

In yet another embodiment, the passive-matrix micro-LEDs comprise green passive-matrix LEDs corresponding to a peak wavelength from 500 nanometers to 550 nanometers, blue passive-matrix LEDs corresponding to a peak wavelength from 440 nanometers to 480 nanometers, and red passive-matrix LEDs corresponding to a peak wavelength from 620 nanometers to 680 nanometers.

In an embodiment, the passive-matrix micro-LED array provides a grayscale represented by 6 bits of data corresponding to the column signals and the scan signals.

In one embodiment, a set of the LED pixels of a column share a common n-electrode. In another embodiment, the display driver is further configured to apply the column signals to the columns at respective times utilizing, e.g., pulse-width modulation (PWM), pulse-frequency modulation (PFM), a current control source, a voltage control source, etc. In another embodiment, a set of the LED pixels of a row of the rows share a common p-electrode.

In yet another embodiment, the display driver is further configured to apply the scan signals to consecutive rows of the rows in a sequential manner via p-electrode stripes of the passive-matrix micro-LED array.

In an embodiment, the display driver can comprise a memory, e.g., random access memory (RAM), a processing component, and a driver component. The processing component can be configured to receive, e.g., from a microcontroller, processor, etc. information, e.g., data, control signals, etc. representing pixel data, and store such information in the memory.

In this regard, the driver component can read the information from the memory and generate, based on the information, the column signals, e.g., 256 signals. Further, the driver component can apply, e.g., in sequence, the column signals to the columns, e.g., 256 columns, of the LED pixels.

In another embodiment, the driver component can be further configured to apply the scan signals to LED pixels of a row of the pixels via a p-electrode stripe.

In yet another embodiment, a system can comprising a clock component configured to generate a control clock, a processor component configured to generate pixel data, and a display, e.g., passive-matrix LEDoS micro-display. The passive-matrix LEDoS display can comprise an array of passive-matrix micro-LEDs, and a display driver that has been flip-chip bonded to the array of passive-matrix micro-LEDs utilizing solder bumps located at peripheral areas of the array of passive-matrix micro-LEDs. In this regard, the display driver can be configured to apply, based on the control clock and the pixel data, first control signals to columns of pixels of the array of passive-matrix micro-LEDs and second control signals to rows of pixels of the array.

In an embodiment, the display driver can be configured to apply the first control signals to the columns of pixels, e.g., utilizing PWM, PFM, a current control source, a voltage source, etc. In one embodiment, the display driver can be configured to apply the second control signals to consecutive rows of the pixels in a sequential manner.

In one embodiment, a method, e.g., of manufacture, of a passive-matrix LEDoS micro-display can comprise forming a layer of gallium nitride (GaN)—e.g., comprising a p-type GaN layer, a multi-quantum well, and an n-type GaN layer—on a sapphire substrate; creating isolation trenches and plateaus adjacent to the isolation trenches in the layer of GaN to form an array of pixels; forming p-type ohmic contacts on the p-type GaN layer corresponding to the array of pixels; depositing n-electrode stripes on the n-type GaN to form n-type ohmic contacts and columns of the array of pixels, in which pixels in a column share a common n-electrode; forming a layer of passivation, e.g., comprising a transparent resist, silicon dioxide, aluminum oxide, silicon nitride, a transparent dielectric, etc. on the isolation trenches, portions of the p-type ohmic contacts, and the n-electrode stripes; and depositing p-electrode stripes on the layer of passivation associated with the p-type ohmic contacts to form rows of the array of pixels, in which pixels in a row share a common p-electrode.

In another embodiment, the creating of the isolation trenches and the plateaus comprises etching the layer of GaN down to the sapphire substrate utilizing inductive plasma etching. In yet another embodiment, the etching of the layer of GaN utilizes plasma enhanced chemical vapor deposited oxide, nitride, or photoresist as a hard mask.

In an embodiment, the forming of the p-type ohmic contacts comprises performing rapid thermal annealing, e.g., of tin-doped indium oxide, nickel and gold, nickel and silver, etc. based materials at a first defined temperature for a second defined time in ambient air, nitrogen, oxygen, etc. In one embodiment, the depositing of the n-electrode stripes electrically connects all pixels of a column and corresponds to an increase of conductivity of n-type GaN corresponding to the column. In another embodiment, the depositing of the p-electrode stripes comprises forming contact holes on the p-type ohmic contacts, and depositing the p-electrode stripes on the contact holes associated with the p-type ohmic contacts.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

Furthermore, to the extent that the terms "includes," "has," "contains," and other similar words are used in either the detailed description or the appended claims, such terms are intended to be inclusive—in a manner similar to the term "comprising" as an open transition word—without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

As utilized herein, the term "component" is intended to refer to hardware, software (e.g., in execution), firmware, logic, and/or a combination thereof. For example, a component can refer to an integrated circuit, an application specific integrated circuit (ASIC), a digital signal processor (DSP), a programmable gate array (PGA), e.g., field PGA (FPGA), programmable logic device (PLD), a complex programmable logic device (CPLD), a discrete gate or transistor logic, discrete hardware components, or any combination thereof designed to perform the functions and/or processes described herein. Processors can exploit nanoscale architectures such as, but not limited to, molecular and quantum-dot based transistors, switches and gates, in order to optimize space usage or enhance performance of mobile devices. A processor may also be implemented as a combination of computing processing units. It should be appreciated that software, firmware, etc. component(s) can execute from various computer readable media having various data structures stored thereon.

As another example, a component can be an apparatus with specific functionality provided by mechanical parts operated by electric or electronic circuitry; the electric or electronic circuitry can be operated by a software application or a firmware application executed by one or more processors; the one or more processors can be internal or external to the apparatus and can execute at least a part of the software or firmware application. In yet another example, a component can be an apparatus that provides specific functionality through electronic components without mechanical parts; the electronic components can comprise one or more processors therein to execute software and/or firmware that confer(s), at least in part, the functionality of the electronic components.

Aspects of systems, apparatus, and processes explained herein can constitute machine-executable instructions embodied within a machine, e.g., embodied in a computer readable medium (or media) associated with the machine. Such instructions, when executed by the machine, can cause the machine to perform the operations described. Additionally, the systems, processes, process blocks, etc. can be embodied within hardware, such as an ASIC or the like. Moreover, the order in which some or all of the process blocks appear in each process should not be deemed limiting. Rather, it should be understood by a person of ordinary skill in the art having the benefit of the instant disclosure that some of the process blocks can be executed in a variety of orders not illustrated.

Furthermore, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art having the benefit of the instant disclosure.

In accordance with various embodiments, processor(s) for implementing embodiments disclosed herein can comprise distributed processing devices, or parallel processing devices, in a single machine, device, etc., or across multiple machines, devices, etc. Furthermore, the processor(s) can comprise a state machine, an ASIC, DSP, PGA, FPGA, PLD, CPLD, etc. In this regard, when the processor(s) execute instruction(s) to perform "operations", the processor(s) can perform the operations directly, and/or facilitate, direct, or cooperate with other device(s) and/or component(s) to perform the operations.

As utilized herein, the terms "logic," "logical," "logically," and the like are intended to refer to any information having the form of instruction signals and/or data that may be applied to direct the operation of a processor. Logic may be formed from signals stored in a device memory. Software is one example of such logic. Logic may also be comprised by digital and/or analog hardware circuits, for example, hardware circuits comprising logical AND, OR, XOR, NAND, NOR, and other logical operations. Logic may be formed from combinations of software and hardware.

As mentioned, conventional display technologies have had some drawbacks with respect to integrating micro-LEDs with an IC in an effective manner. Various embodiments disclosed herein can improve display performance and manufacturing yields by providing a passive-matrix LEDoS micro-display comprising a micro-LED array that has been flip-chip bonded onto, e.g., an ASIC, display driver.

Figure 2:
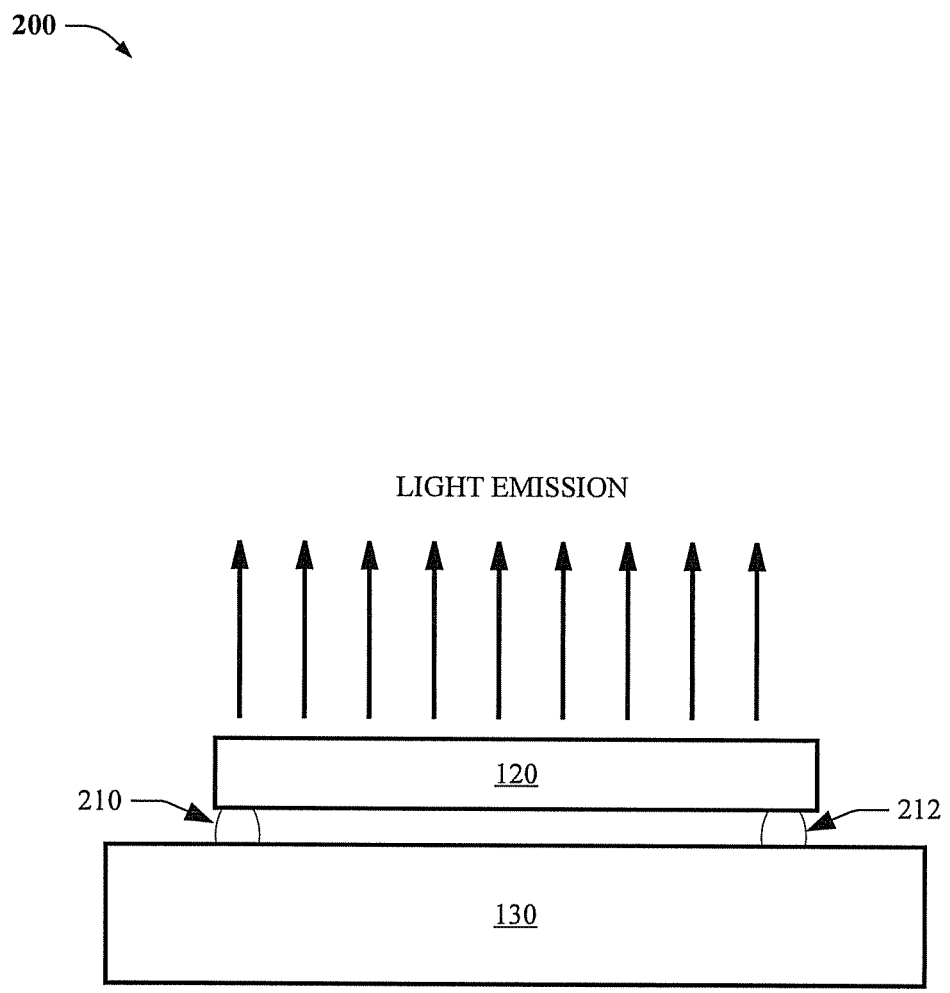
FIG. 2 illustrates a block diagram of a side view of the LEDoS micro-display, in accordance with various embodiments.
Figure 3:
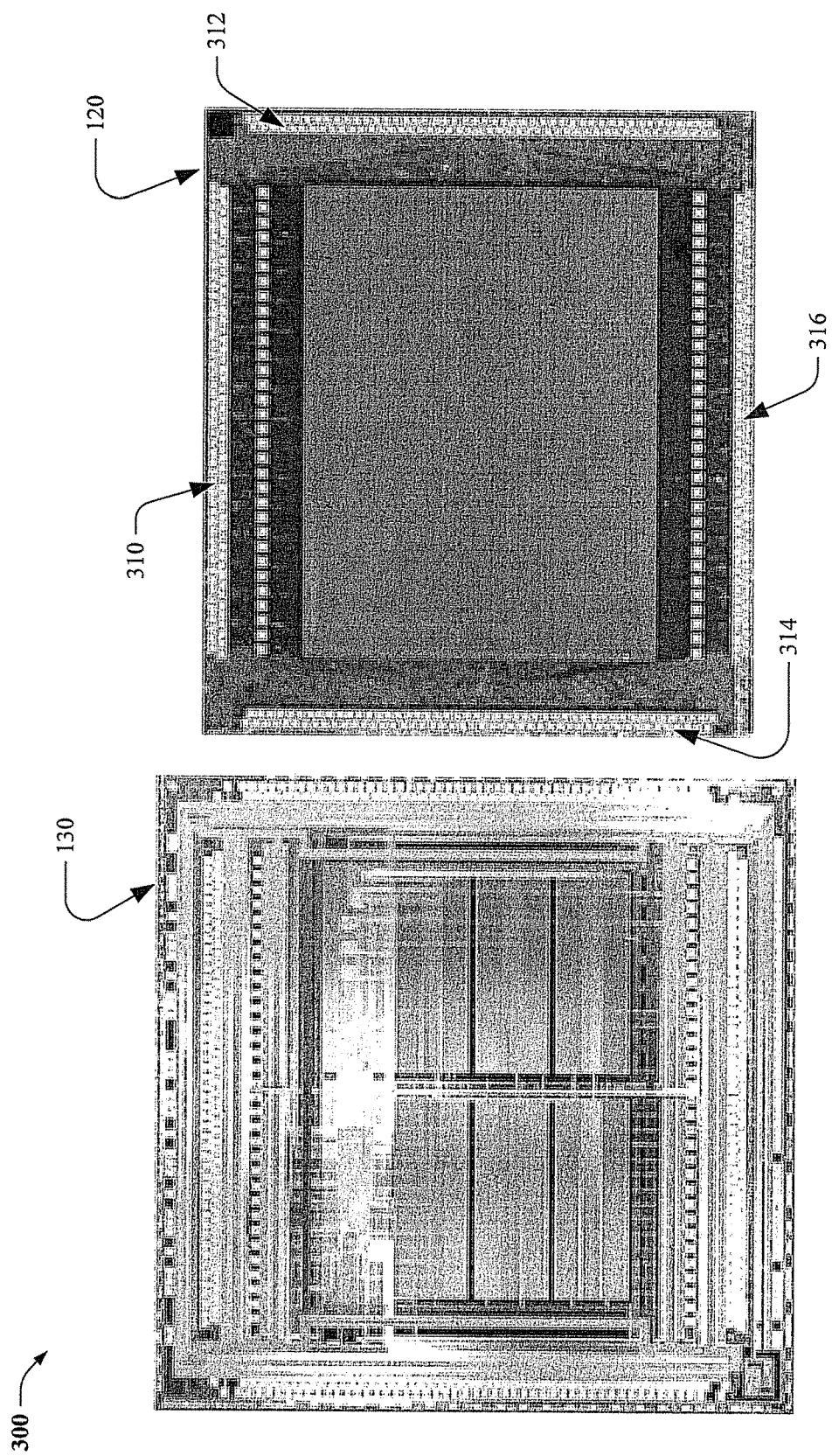
FIG. 3 illustrates top views of an ASIC display driver and 256×192 micro-LED array before flip-chip bonding, in accordance with various embodiments.

Now referring to FIGS. 1-3, a block diagram of a top view of an LEDoS micro display (100), a block diagram of a side view of the LEDoS micro-display, and top views of an ASIC display driver (e.g. 130) and an 256×192 micro-LED array (e.g. 120) before flip-chip bonding are illustrated, respectively, in accordance with various embodiments.

As illustrated by FIG. 1, passive-matrix micro-LED array 120 comprises, e.g., addressable, computer addressable, etc. passive-matrix micro-LEDs (110), e.g., corresponding to 256×192 pixels, e.g., within a diagonal display area of 0.19 inches. Further, passive-matrix micro-LED array 120 is flip-chip bonded to display driver 130, e.g., an ASIC, DSP, PGA, FPGA, PLD, CPLD, etc. based on solder bumps 210, 212, etc. (e.g., indium bumps, gold bumps, copper bumps, tin bumps, alloy bumps, etc) located, positioned, etc. at peripheral areas of passive-matrix micro-LED array 120, e.g., corresponding to indium plates 310, 312, 314, and 316 that have been distributed around the periphery of passive-matrix micro-LED array 120. In other embodiment(s), plates comprising gold, copper, tin, alloy, etc. can be distributed around the periphery of passive-matrix micro-LED array 120. In this regard, in an embodiment, only 448 solder bumps, bumps, etc. located near the periphery of passive-matrix micro LED array 120 are used to bond passive-matrix micro-LED array 120 to display driver 130—instead of providing a solder bump for each pixel of the more than 49,000 pixels of passive-matrix micro-LED array 120.

In another embodiment, passive-matrix micro-LED array 120 can be bonded to display driver 130 utilizing an anisotropic conductive film (ACF) or an anisotropic conductive paste (ACP)—the solder bumps replaced by the ACF or ACP.

In one embodiment, passive-matrix micro-LED array 120 corresponds to a chip size of 5.1×4.5 $mm^2$ and a display area of 3.8×2.9 $mm^2$. In this regard, each pixel of passive-matrix micro LED array 120 corresponds to a pixel size of 14×7 $\mu m^2$ and pixel pitch of 15 μm.

In another embodiment, passive-matrix micro-LED array 120 comprises 1700 pixels per inch (PPI). In yet another embodiment, the passive-matrix micro LEDs comprise green passive-matrix LEDs corresponding to a peak wavelength from 500 nanometers to 550 nanometers, blue passive-matrix LEDs corresponding to a peak wavelength from 440 nanometers to 480 nanometers, and red passive-matrix LEDs corresponding to a peak wavelength from 620 nanometers to 680 nanometers.

Figure 4:
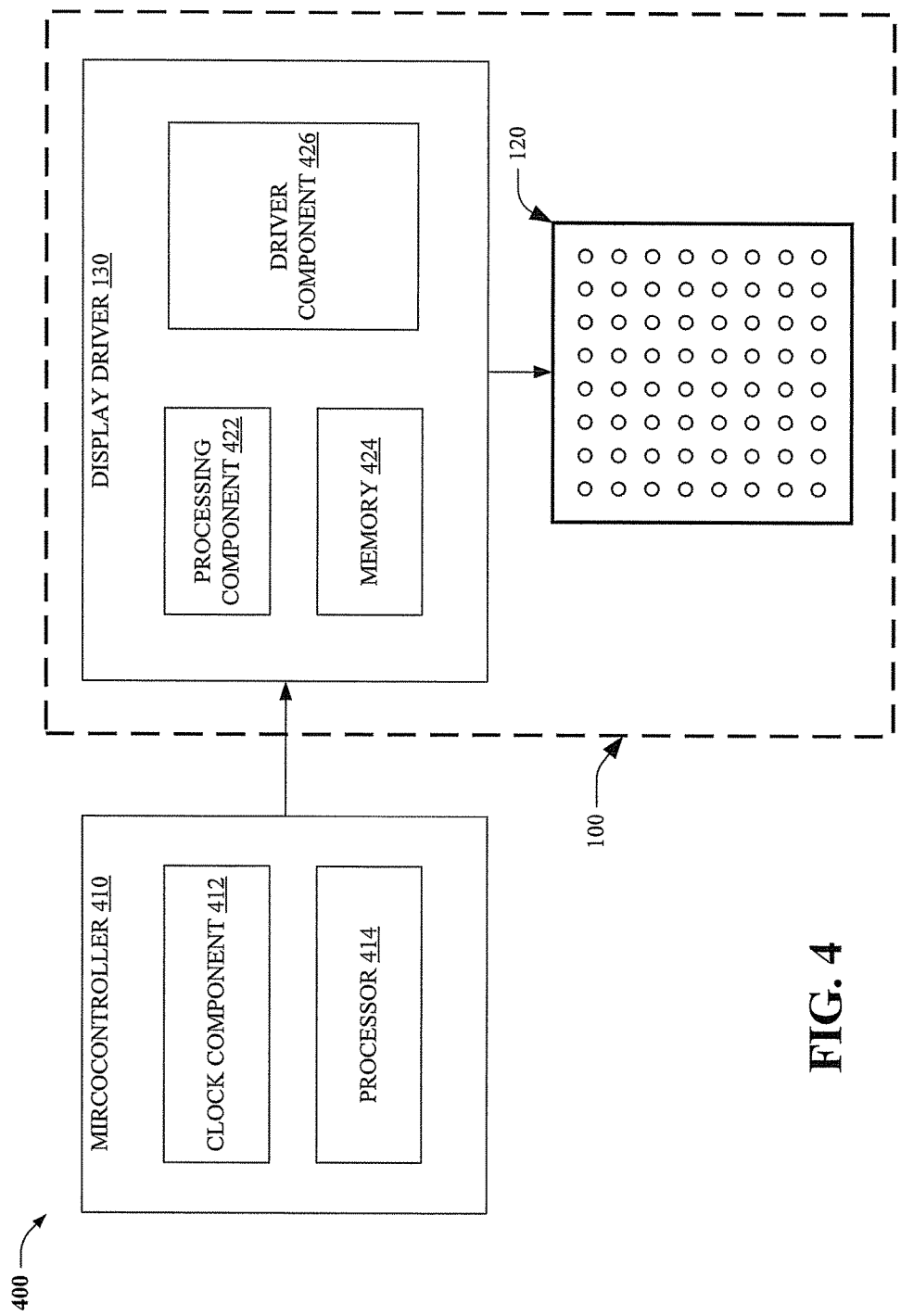
FIG. 4 illustrates a block diagram of the LEDoS micro-display coupled to a microcontroller, in accordance with various embodiments.

FIG. 4 illustrates a block diagram of an LEDoS micro-display (100) coupled to a microcontroller (410), in accordance with various embodiments. In this regard, microcontroller 410 can comprise clock component 412 configured to generate a control clock, and processor 414 configured to generate pixel data. It should be appreciated by a person of ordinary skill in the art of display technology having the benefit of the instant disclosure that clock component 412 can be separate, external, distinct, etc. from microcontroller 410, e.g., in this regard, clock component can comprise an external oscillator.

As illustrated by FIG. 4, display driver 130 can comprise processing component 422, memory 424, e.g., random access memory (RAM), and driver component 426. Further, processing component 422 can be configured to receive, from microcontroller 410, information, e.g., data, control signals, etc. representing pixel data, and store such information in memory 424. Further, driver component 426 can read the information from memory 424 and generate, based on the information, column signals, e.g., 256 signals, and scan signals, e.g., 192 signals. Furthermore, driver component 426 can apply, e.g., in sequence, the column signals to columns, e.g., 256 columns, of addressable LED pixels, e.g., corresponding to respective passive-matrix micro-LEDs (110) of passive-matrix micro LED array 120, and apply the scan signals to rows, e.g., 192 rows, of the LED pixels.

Figure 5:
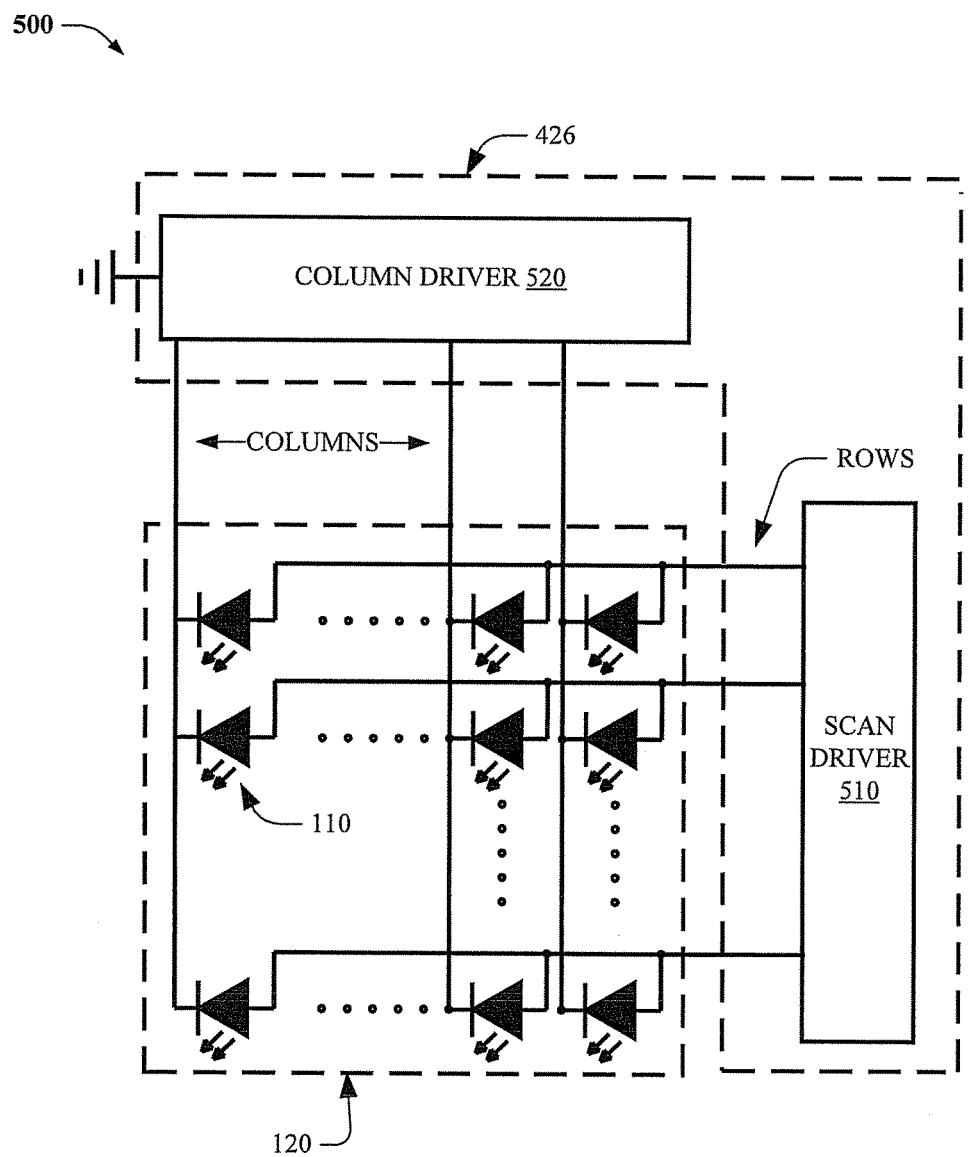
FIG. 5 illustrates a block diagram of components of a driver component coupled to a passive-matrix micro-LED array, in accordance with various embodiments.

For example, and now referring to FIG. 5, driver component 426 can include column driver 520 that can be configured to apply signals, column signals, etc. to columns of LED pixels, e.g., corresponding to respective passive-matrix micro-LEDs (110) of passive-matrix micro-LED array 120. Further, driver component 426 can include scan driver 510 that can be configured to apply scan signals to rows of the LED pixels. In an embodiment, passive-matrix micro-LED array 120 provides a grayscale represented by 6 bits of data corresponding to the column signals and the scan signals.

In one embodiment, a set of the LED pixels of a column of the columns share a common n-electrode. In another embodiment, column driver 520 can be further configured to apply the column signals to the columns at respective times, e.g., utilizing PWM, PFM, a current control source, a voltage control source, etc. In yet another embodiment, a set of the LED pixels of a row of the rows shares a common p-electrode. In this regard, in an embodiment, scan driver 510 can be configured to apply the scan signals, e.g., greater than 3 V DC, to consecutive rows of the rows in a sequential manner via p-electrode stripes of passive-matrix micro-LED array 120.

Figure 6:
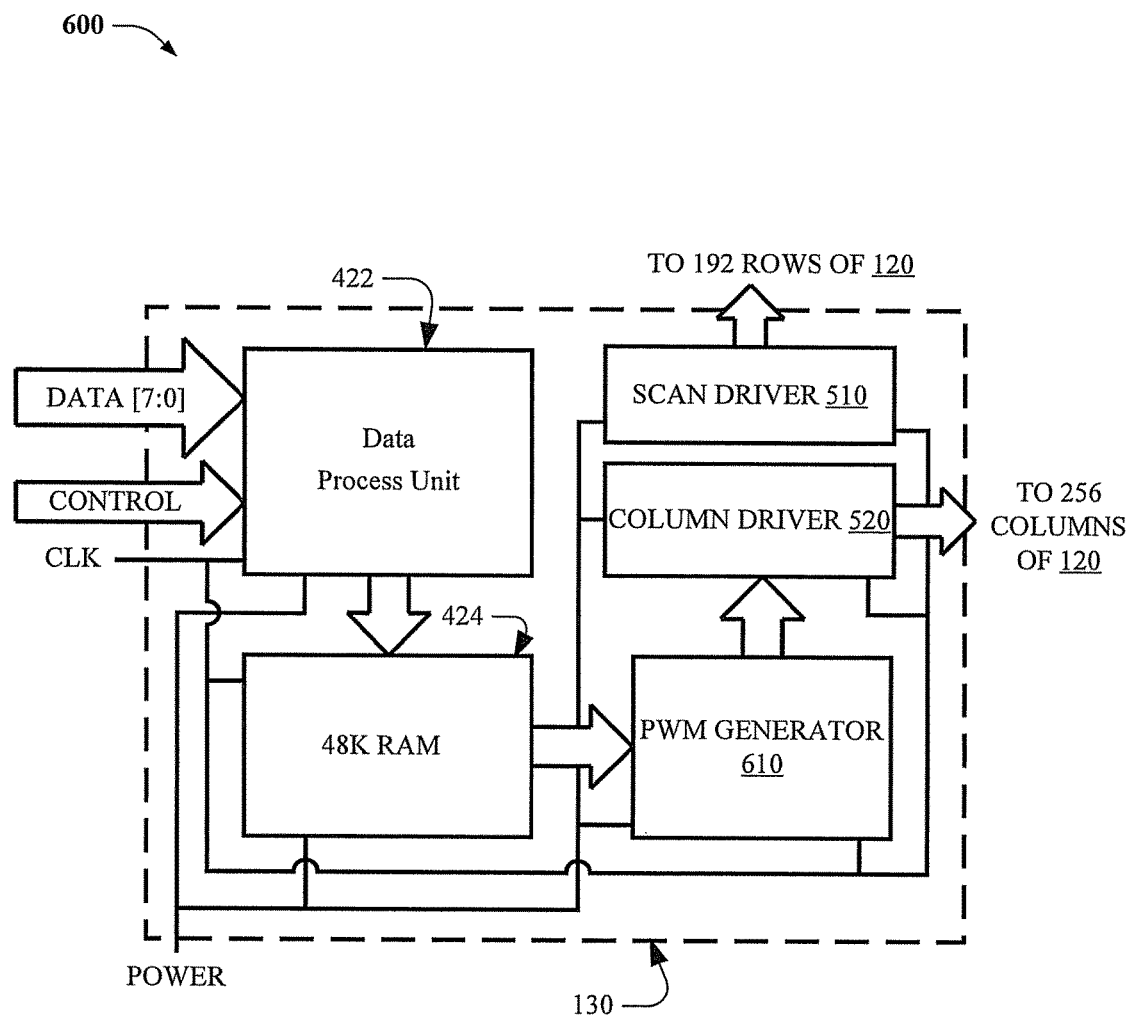
FIG. 6 illustrates a block diagram of components of a display driver of an LEDoS micro-display, in accordance with various embodiments.

FIG. 6 illustrates a block diagram (600) of components of a display driver (130) of an LEDoS micro-display (100), in accordance with various embodiments. In this regard, display driver 130 comprises an ASIC, e.g., fabricated in by 0.18 μm CMOS technology. As illustrated by FIG. 6, display driver 130 comprises processing component 422, e.g., data process unit, memory 424, e.g., 48 K kilobytes (49,152 bytes) RAM, scan driver 510, column driver 520, and PWM generator 610.

Data processing unit can read data signals, e.g., from an 8-bit data bus, and control signals from microcontroller 410. Further, the data processing unit can write the data to the 48 K RAM. PWM generator 610 can read the data from the 48 K RAM in sequence and generate 256 PWM driving signals for 256 columns of passive-matrix micro-LED array 120, e.g., via column driver 520, and generate 192 signals for 192 rows of passive-matrix micro-LED array 120, e.g., via scan driver 510. Further, PWM generator 610 can create 6-bit grayscale, e.g., to provide more satisfactory display quality. In an embodiment, scan driver 510 and column driver 520 can generate enough control voltage to turn pixels of passive-matrix micro-LED array 120 on and off. In another embodiment, display driver 130 can operate at a clock (CLK) frequency of 48 MHz. In yet another embodiment, display driver 130 can display 16 frames per second.

Figure 7:
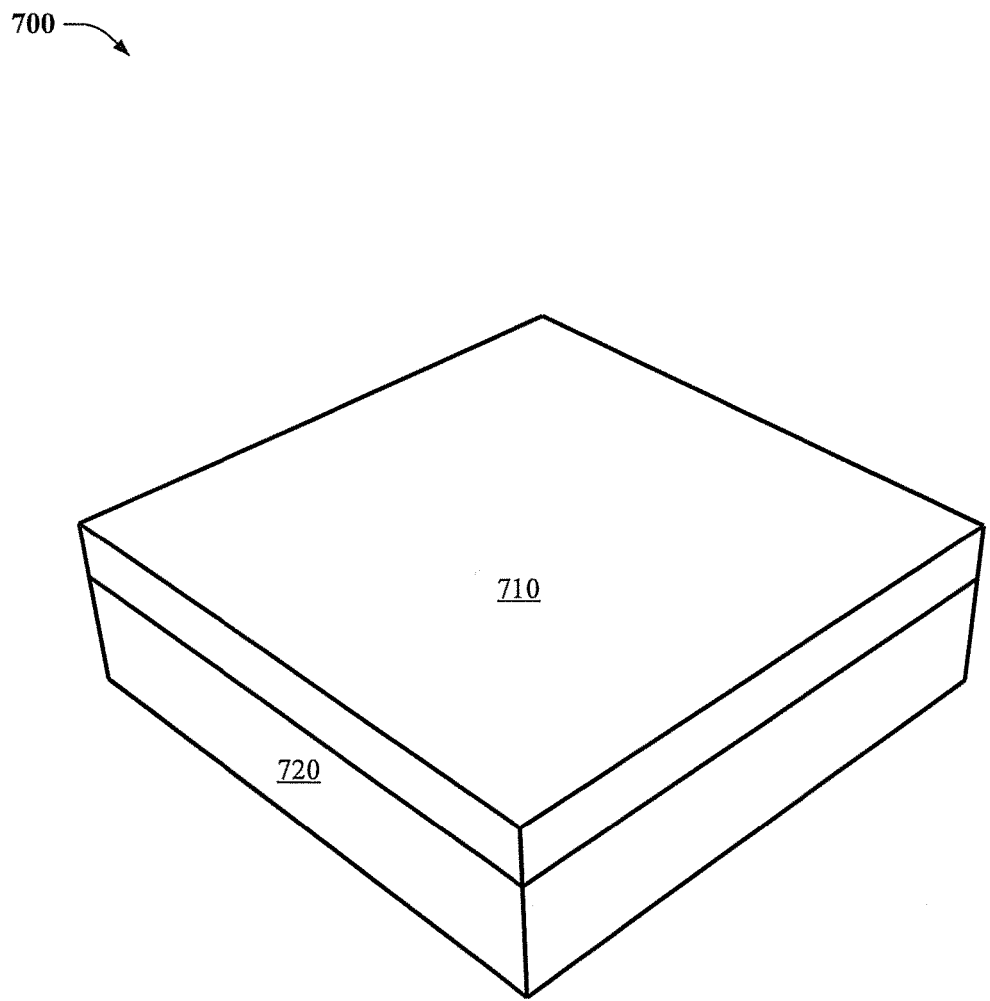
FIG. 7 illustrates a block diagram of a layer of gallium nitride (GaN)—comprising a p-type GaN layer, a multi-quantum well, and an n-type GaN layer—formed on a sapphire substrate, in accordance with various embodiments.

Referring now to FIGS. 7-13, various fabrication states corresponding to a method of manufacturing an LEDoS micro-display (100), and the method of manufacturing the LEDoS micro-display, are illustrated, in accordance with various embodiments. FIG. 7 illustrates a layer of GaN (710) formed on a sapphire substrate (720). In other embodiments (not shown), the layer of GaN (710) can comprise a p-type GaN layer (not shown), a multi-quantum well (not shown), and an n-type GaN layer (not shown).

Figure 8:
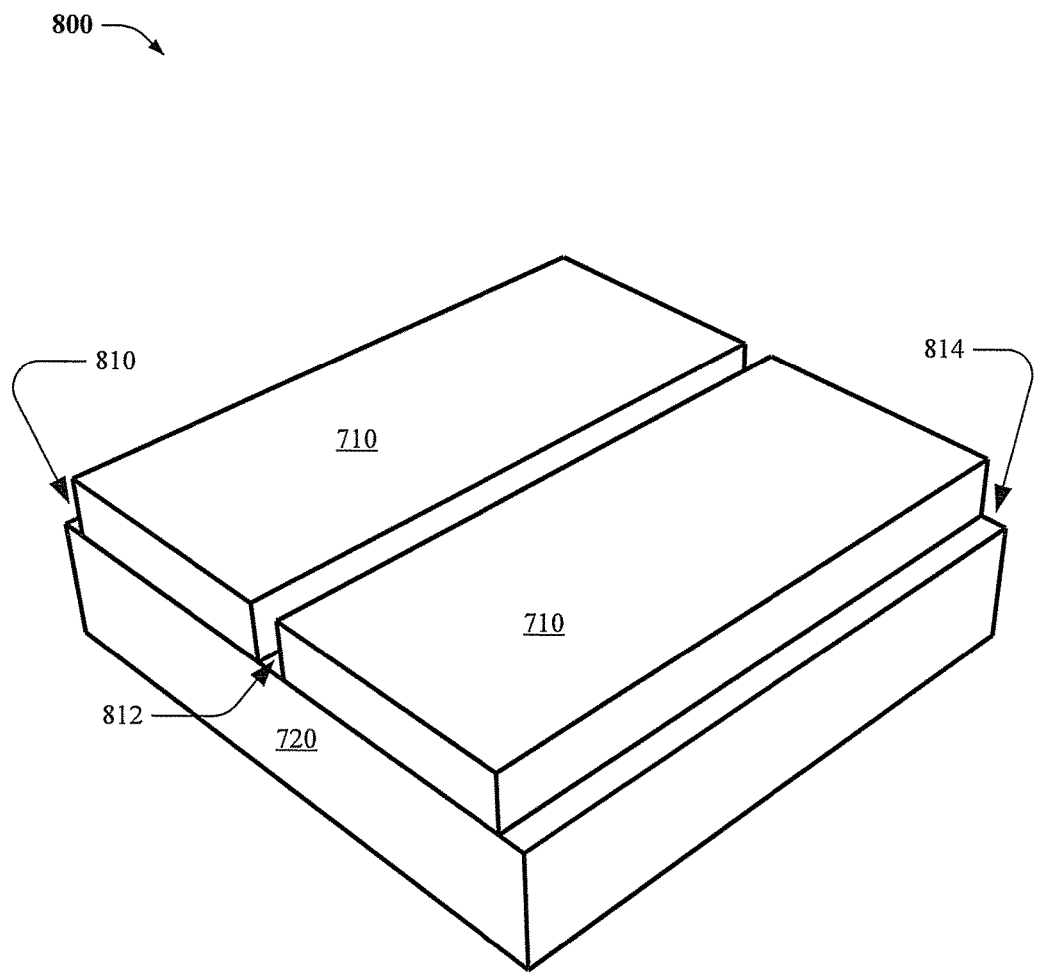
FIG. 8 illustrates a block diagram of a layer of GaN with isolation trenches, in accordance with various embodiments.
Figure 9:
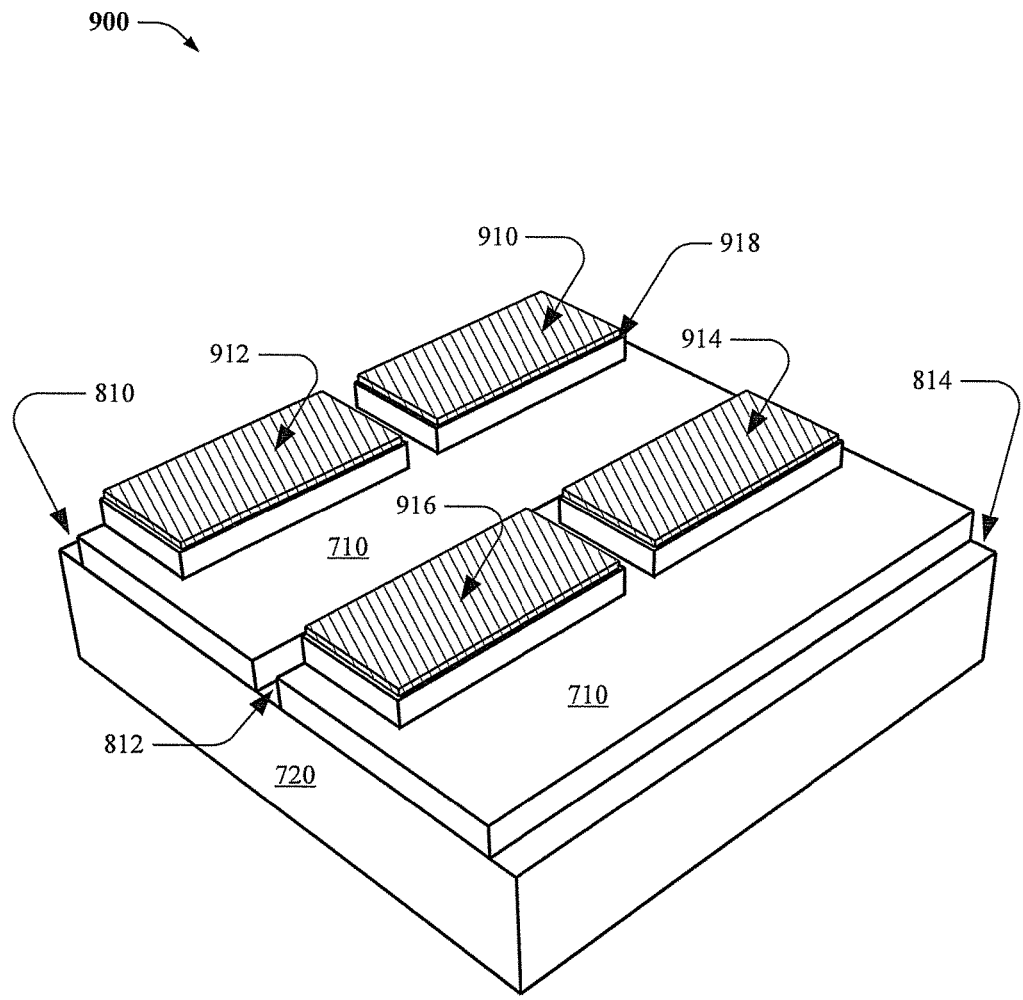
FIG. 9 illustrates a block diagram of a formation of p-type ohmic contacts on an array of pixels, in accordance with various embodiments.
Figure 10:
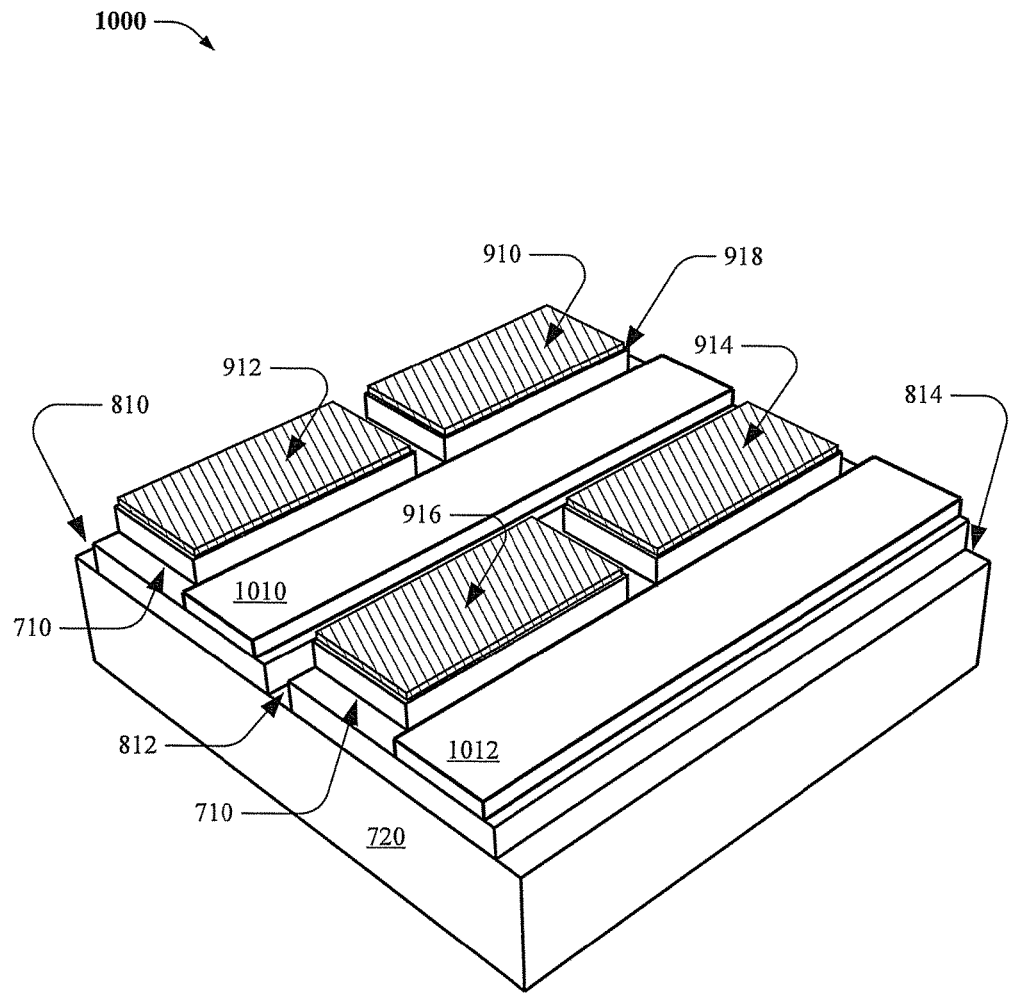
FIG. 10 illustrates a block diagram of n-electrode stripes deposited on a layer of n-type GaN to form n-type ohmic contacts and columns of an array of pixels, in accordance with various embodiments.

FIG. 8 illustrates isolation trenches (810, 812, and 814) created within the layer of GaN. FIG. 9 illustrates p-type ohmic contacts (910, 912, 914, and 916) formed on top of the array of pixels, e.g., on plateaus adjacent to the isolation trenches, e.g., using ITO, layers of metals comprising, e.g., nickel, gold, silver, titanium, aluminum, etc. FIG. 10 illustrates n-electrode stripes, e.g., ohmic contacts, etc. (1010 and 1012) deposited on an n-type GaN layer (e.g., 918) to form columns of the array of pixels. In this regard, pixels of a column of the columns share a common n-electrode.

Figure 11:
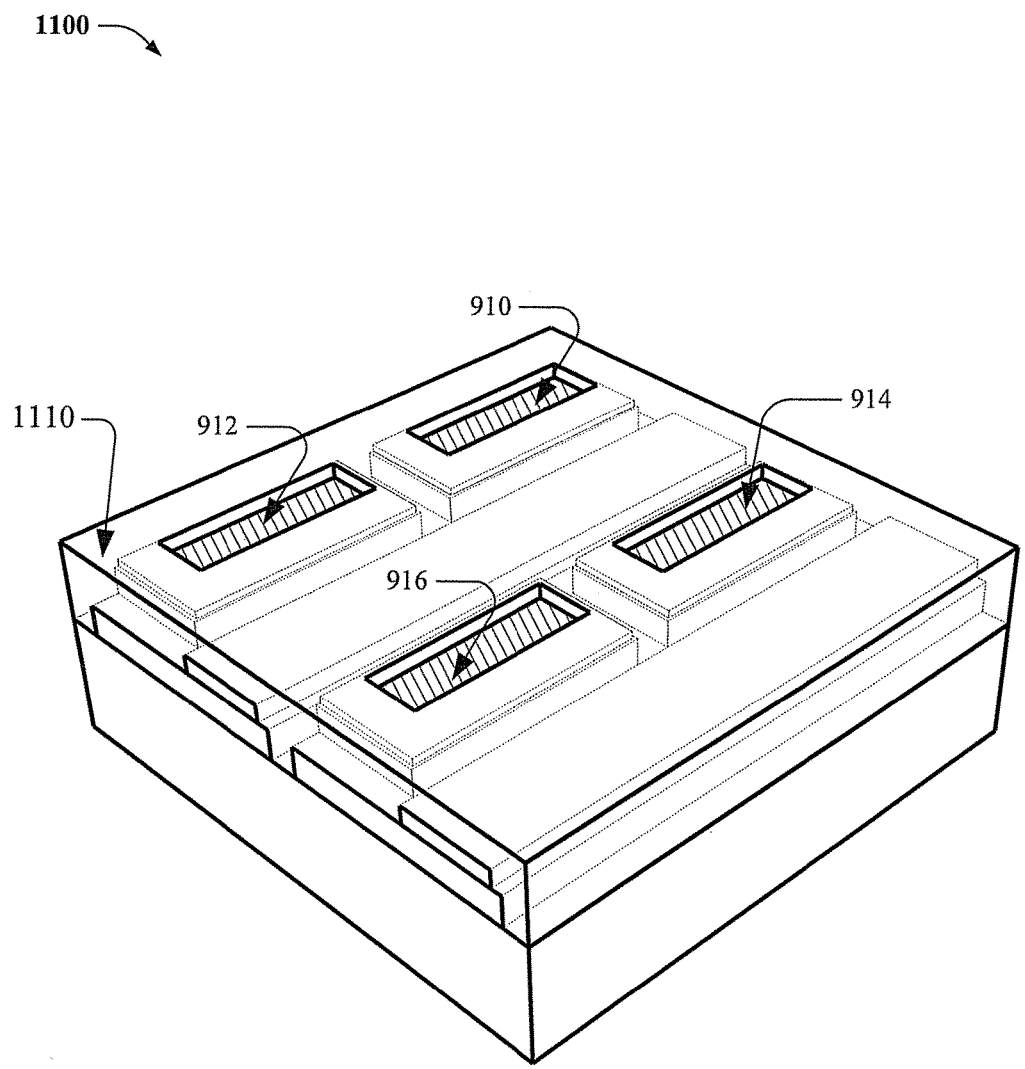
FIG. 11 illustrates a block diagram of a layer of a transparent and non-conductive dielectric formed on the isolation trenches, portions of the p-type ohmic contacts, and the n-electrode stripes, in accordance with various embodiments.
Figure 12:
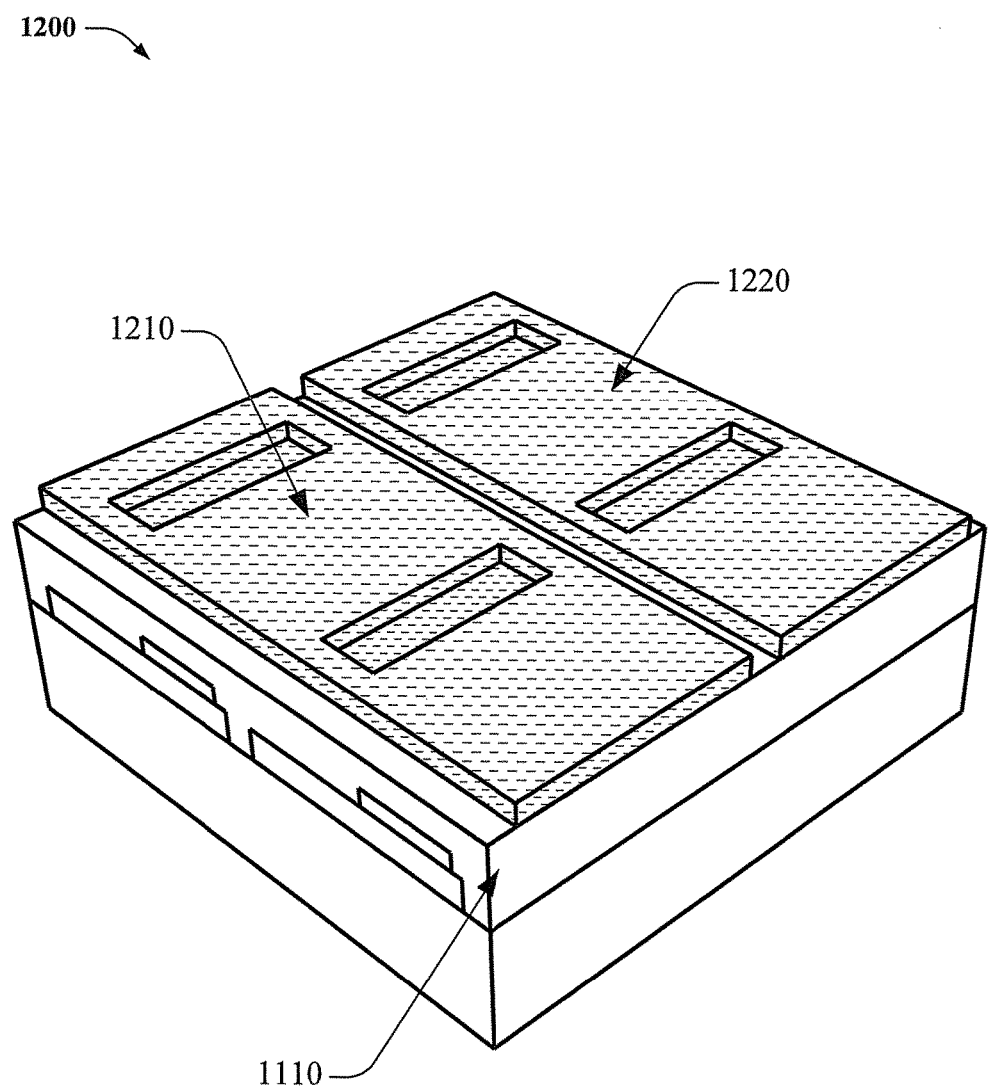
FIG. 12 illustrates a block diagram of p-electrode stripes deposited on the layer of the transparent and non-conductive dielectric to form rows of the array of pixels, in accordance with various embodiments.

FIG. 11 illustrates a layer of passivation (1110), e.g., comprising a transparent resist, silicon dioxide, aluminum oxide, silicon nitride, a transparent dielectric, a transparent and non-conductive dielectric etc. formed on the isolation trenches, portions of the p-type ohmic contacts, and the n-electrode stripes. FIG. 12 illustrates p-electrode stripes (1210 and 1220) deposited on the layer of passivation to form rows of the array of pixels. In this regard pixels of a row of the rows share a common p-electrode.

Figure 13:
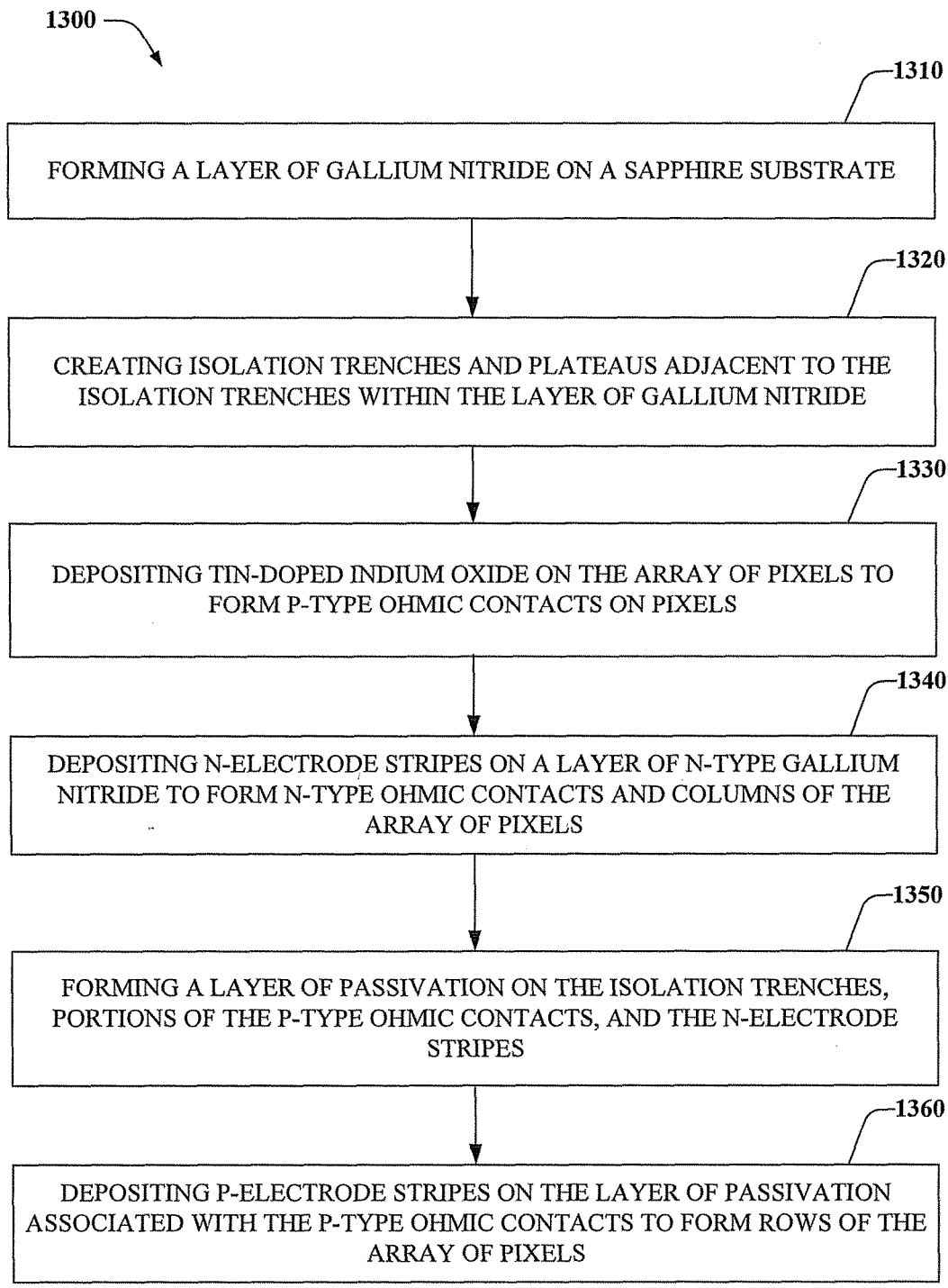
FIG. 13 illustrates a method of manufacturing an LEDoS micro-display, in accordance with various embodiments.

Referring now to FIG. 13, a method (1300) of manufacturing an LEDoS micro-display (100) is illustrated, in accordance with various embodiments. For simplicity of explanation, the method is depicted and described as a series of acts. It is to be understood and appreciated that the subject innovation is not limited by the acts illustrated and/or by the order of acts. For example, acts can occur in various orders and/or concurrently, and with other acts not presented or described herein. Furthermore, not all illustrated acts may be required to implement methodologies in accordance with the disclosed subject matter. In addition, those skilled in the art will understand and appreciate such methodologies could alternatively be represented as a series of interrelated states via a state diagram or events.

At 1310, a layer of GaN, e.g., comprising a p-type GaN layer, a multi-quantum well, and a layer of n-type GaN, can be formed on a sapphire substrate. At 1320, isolation trenches and plateaus adjacent to the isolation trenches can be created within the layer of GaN. In an embodiment, the isolation trenches can be created via induction coupled plasma (ICP) etching of GaN down to the sapphire substrate, e.g., using plasma enhanced chemical vapor deposited (PECVD) oxide or photoresist as a hard mask.

In another embodiment, dimensions of pixels of the array of pixels can be defined by standard photolithography. In this regard, photo resist pixel patterns can be transferred to GaN by ICP etching down to an n-type GaN layer.

At 1330, ITO can be deposited, selectively deposited, etc. on the array of pixels to form p-type ohmic contacts on the p-type GaN layer corresponding to the pixels. In an embodiment, an ohmic characteristic of the pixels can be achieved after rapid thermal annealing at 700° C. for 5 minutes in air ambient.

At 1340, n-electrode stripes can be deposited on the layer of n-type GaN to form n-type ohmic contacts and columns of the array of pixels, in which pixels of a column share a common n-electrode. In one embodiment, the n-electrode stripes can connect the pixels of the column and increase the conductivity of the layer of n-type GaN, and can improve the uniformity of pixel brightness in each column.

At 1350, a layer of passivation, e.g., comprising a transparent resist, silicon dioxide, aluminum oxide, silicon nitride, a transparent dielectric, a transparent and non-conductive dielectric, etc. can be formed on the isolation trenches, portions of the p-type ohmic contacts, and the n-electrode stripes. In this regard, the layer of passivation can perform passivation and isolation. In an embodiment, contact holes can be defined on the p-type ohmic contacts by photolithography, e.g., for wiring of p-electrode stripes.

At 1360, p-electrode stripes can be deposited on the layer of passivation associated with the p-type ohmic contacts, e.g., on the contact holes, to form rows of the array of pixels, in which a p-electrode stripe of a row connects pixels of the row.

In one embodiment (not shown), indium, gold, copper, tin, alloy, etc. plates (see e.g. 310, 312, 314, and 316) can be deposited and formed on electrode pads of passive-matrix micro-LED array 120 via a thermal evaporation and lift-off process, an electroplating process, or a direct placing method. Further, ball-shaped indium can be formed by placing the passive-matrix micro-LED array 120 with indium plates into a reflow furnace at 220° C. for 1 minute in formic acid. Further, after such "indium bumping process", passive-matrix micro-LED array 120 can be flip-chip bonded onto display driver 130 to form LEDoS micro-display (100), e.g., utilizing a flip-chip bonder with an alignment accuracy of 1 μm.

Figure 14:
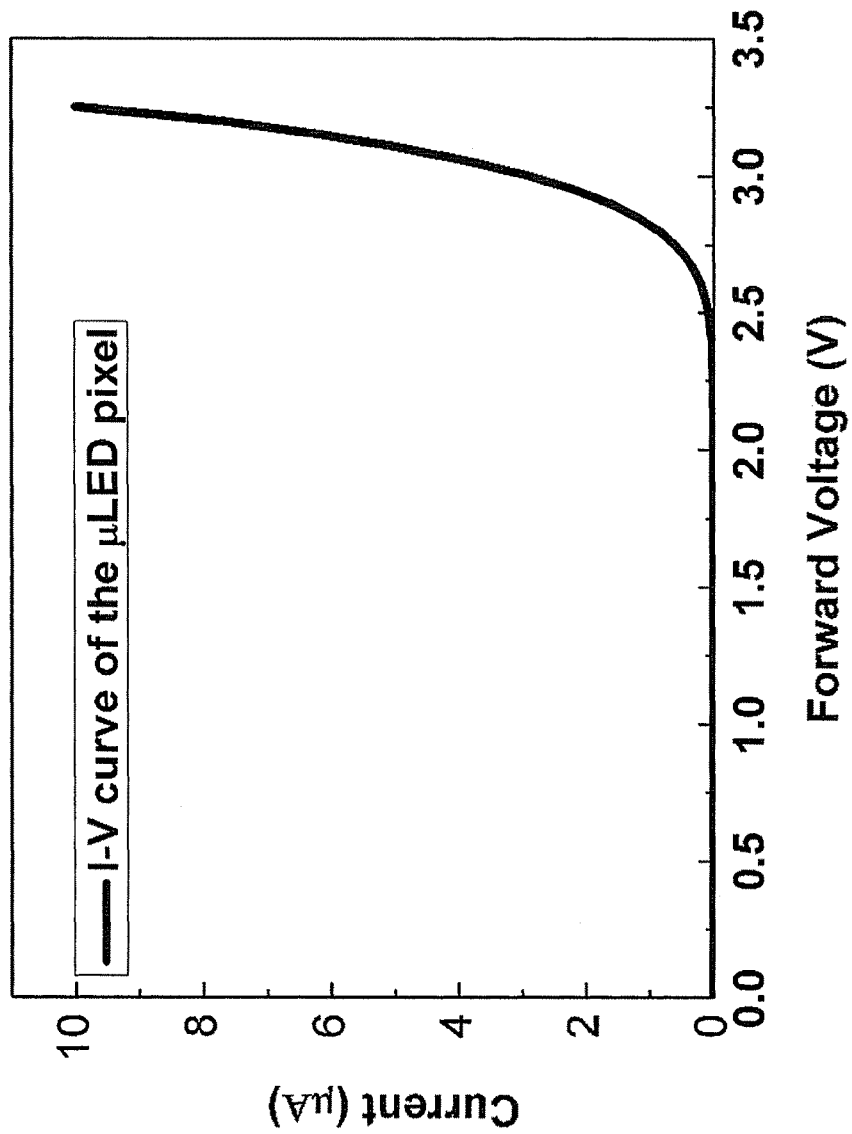
FIG. 14 illustrates simulation results of a pixel of an LEDoS micro-display, in accordance with various embodiments.

FIG. 14 illustrates simulation results of a pixel of an LEDoS micro-display (100), in accordance with various embodiments. As illustrated by FIG. 14, the forward voltage of a single pixel of the LEDoS micro-display is ~3.2 V at 10 μA—the I-V characteristic of the single pixel measured by direct probing of passive-matrix micro-LED array 120.

The brightness of the LEDoS micro-display was measured by a Spectrascan colorimeter, in which the maximum brightness of the LEDoS micro-display was measured to be 1300 mcd/m$^2$, at a calculated average injection current to passive-matrix micro-LED array 120 of 20 mA. Further, the total power consumption of the LEDoS micro-display was 0.6 W. The operating temperature of the LEDoS micro-display ranges from 125 to −55° C., tested in a Votsch thermal cycling chamber.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A display, comprising:
   a passive-matrix inorganic micro-light-emitting diode (LED) array comprising passive-matrix addressable inorganic micro-LED pixels; and
   a display driver configured to apply column signals to columns of the passive-matrix inorganic micro-LED array and scan signals to rows of the passive-matrix inorganic micro-LED array, wherein anodes of a first group of inorganic LEDs of the passive-matrix inorganic micro-LED array are connected to a row of the rows, wherein the row comprises a p-electrode stripe that is connected to contact holes associated with respective p-type ohmic contacts that connect pixels of the passive-matrix addressable inorganic micro-LED pixels to the display driver via solder bumps corresponding to respective plates located at peripheral areas of the passive-matrix inorganic micro-LED array, wherein cathodes of a second group of inorganic LEDs of the passive-matrix inorganic micro-LED array are connected to a column of the columns, and wherein the inorganic LEDs comprise respective doped layers of gallium nitride that have been formed on a sapphire-based substrate.

2. The display of claim 1, wherein a first number of the solder bumps is less than a second number of the passive-matrix addressable inorganic micro-LED pixels.

3. The display of claim 1, wherein the solder bumps comprise at least one of indium, gold, copper, lead, tin, or alloy.

4. The display of claim 1, wherein the solder bumps are replaced by anisotropic conductive film (ACF) or anisotropic conductive paste (ACP).

5. The display of claim 1, wherein the passive-matrix addressable inorganic micro-LED pixels comprise green passive-matrix inorganic LEDs corresponding to a peak wavelength from 500 nanometers to 550 nanometers, blue passive-matrix inorganic LEDs corresponding to a peak wavelength from 440 nanometers to 480 nanometers, and red passive-matrix inorganic LEDs corresponding to a peak wavelength from 620 nanometers to 680 nanometers.

6. The display of claim 1, wherein the passive-matrix inorganic micro-LED array provides a grayscale represented by 6 bits of data corresponding to the column signals and the scan signals.

7. The display of claim 1, wherein the column comprises a common n-electrode.

8. The display of claim 7, wherein the display driver is further configured to apply a column signal of the column signals to the common n-electrode.

9. The display of claim 1, wherein the row comprises a common p-electrode.

10. The display of claim 9, wherein the display driver is further configured to apply the scan signals to consecutive rows of the rows in a sequential manner via p-electrode stripes comprising the p-electrode stripe.

11. The display of claim 1, wherein the display driver comprises:
    a memory;
    a processing component configured to receive data and store the data in the memory; and
    a driver component configured to:
       read the data from the memory and generate, based on the data, the column signals; and
       apply the column signals to the columns.

12. The display of claim 11, wherein the driver component is further configured to apply a scan signal of the scan signals to the row via the p-electrode stripe.

13. A system, comprising:
    a clock component configured to generate a control clock;
    a processor component configured to generate pixel data; and
    a display, comprising:
       an array of passive-matrix inorganic micro-light-emitting diodes (LEDs) comprising a layer of gallium nitride that has been formed on a sapphire substrate; and
       a display driver that is configured to apply, based on the control clock and the pixel data, first control signals to columns of pixels of the array of passive-matrix inorganic micro-LEDs and second control signals to rows of the pixels, wherein a row of the rows is connected to anodes of first diodes of the array of passive-matrix inorganic micro-LEDs, wherein the row comprises a p-electrode stripe that is connected to contact holes associated with respective p-type ohmic contacts that connect the pixels of the array of passive-matrix inorganic micro-LEDs to the display driver via solder bumps corresponding to respective plates located at peripheral areas of the array of passive-matrix inorganic micro-LEDs, and wherein a column of the columns is connected to cathodes of second diodes of the array of passive-matrix inorganic micro-LEDs.

14. The system of claim 13, wherein the column comprises an n-electrode.

15. The system of claim 13, wherein the display driver is further configured to apply the second control signals to consecutive rows of the rows of the pixels in a sequential manner.

16. A method, comprising:
applying, by a system comprising a processor, first signals to columns of pixels of an array of passive-matrix inorganic micro-light-emitting diodes (LEDs) comprising gallium nitride and sapphire, wherein a column of the columns is connected to cathodes of a first group of inorganic LEDs of the array of passive-matrix inorganic micro-LEDs; and
applying, by the system via solder bumps corresponding to respective plates located a peripheral areas of the array of passive-matrix inorganic micro-LEDs, second signals to rows of the pixels, wherein a row of the rows is connected to anodes of a second group of inorganic LEDs of the array of passive-matrix inorganic micro-LEDs, and wherein the row comprises a p-electrode stripe that is connected to contact holes associated with respective p-type ohmic contacts that connect the pixels to respective solder bumps of the solder bumps.

17. The method of claim 16, wherein the column comprises an n-electrode, and wherein the applying the first signals comprises applying a signal of the first signals to the n-electrode.

18. The method of claim 16, wherein the applying the second signals comprises applying a signal of the second signals to the p-electrode stripe.

19. The method of claim 16, wherein the applying the first signals comprises applying the first signals to the columns at respective times utilizing pulse width modulation.

20. The method of claim 16, wherein the applying the first signals comprises applying the first signals to the columns at respective times utilizing pulse-frequency modulation.

21. The method of claim 16, wherein the applying the second signals comprises applying the second signals to consecutive rows of the rows in a sequential manner.

* * * * *